United States Patent
Ozaki et al.

(10) Patent No.: US 7,402,340 B2
(45) Date of Patent: Jul. 22, 2008

(54) HIGH THERMAL CONDUCTIVE ELEMENT, METHOD FOR MANUFACTURING SAME, AND HEAT RADIATING SYSTEM

(75) Inventors: Toyokazu Ozaki, Nara (JP); Akira Taomoto, Kyotanabe (JP); Mitsuru Hashimoto, Nara (JP); Masahiro Deguchi, Hirakata (JP); Motoshi Shibata, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/822,334

(22) Filed: Jul. 5, 2007

(65) Prior Publication Data

US 2007/0259186 A1    Nov. 8, 2007

Related U.S. Application Data

(60) Division of application No. 11/242,907, filed on Oct. 5, 2005, now Pat. No. 7,252,795, which is a continuation of application No. PCT/JP2004/012671, filed on Aug. 26, 2004.

(30) Foreign Application Priority Data

| Aug. 26, 2003 | (JP) | ............................. 2003-300892 |
| Oct. 14, 2003 | (JP) | ............................. 2003-353443 |
| Mar. 22, 2004 | (JP) | ............................. 2004-82235 |

(51) Int. Cl.
B32B 9/00 (2006.01)
(52) U.S. Cl. .................... 428/408; 423/447.2
(58) Field of Classification Search ................ 428/408; 423/447.2, 448; 432/209; 237/1 R; 524/496
See application file for complete search history.

(56) References Cited

U.S. PATENT DOCUMENTS

| 4,225,569 | A | 9/1980 | Matsui et al. |
| 4,759,977 | A | 7/1988 | Fukuda et al. |
| 4,882,103 | A | 11/1989 | Kawakubo et al. |
| 4,954,193 | A | 9/1990 | Murakami et al. |
| 5,091,025 | A | 2/1992 | Murakami et al. |
| 5,152,938 | A | 10/1992 | Suda |
| 7,071,258 | B1 * | 7/2006 | Jang et al. .................... 524/496 |
| 7,108,917 | B2 * | 9/2006 | Klug .......................... 428/408 |
| 7,252,795 | B2 * | 8/2007 | Ozaki et al. ................. 264/29.7 |
| 7,341,781 | B2 * | 3/2008 | Klug .......................... 428/408 |

(Continued)

FOREIGN PATENT DOCUMENTS

JP     58-147087 A     9/1983

(Continued)

*Primary Examiner*—N Edwards
(74) *Attorney, Agent, or Firm*—McDermott Will & Emery LLP

(57) ABSTRACT

It is an object of the present invention to provide a high thermal conductive element that has improved thermal conductivity in the layer direction while retaining the high thermal conductivity characteristics in the planar direction possessed by graphite. The present invention is a high thermal conductive element in which carbon particles are dispersed in a graphite-based matrix, wherein (1) the c axis of the graphene layers constituting the graphite are substantially parallel, (2) the thermal conductivity $\kappa \parallel$ in a direction perpendicular to the c axis is at least 400 W/m·k and no more than 1000 W/m·k, and (3) the thermal conductivity $\kappa \perp$ in a direction parallel to the c axis is at least 10 W/m·k and no more than 100 W/m·k.

21 Claims, 12 Drawing Sheets

U.S. PATENT DOCUMENTS

| | | |
|---|---|---|
| 2002/0197923 A1 | 12/2002 | Tobita et al. |
| 2004/0131533 A1 | 7/2004 | Spacie et al. |
| 2006/0035085 A1* | 2/2006 | Ozaki et al. .................. 428/408 |
| 2006/0125131 A1 | 6/2006 | Suda et al. |

FOREIGN PATENT DOCUMENTS

| | | |
|---|---|---|
| JP | 60-012747 A | 1/1985 |
| JP | 61-145266 A | 7/1986 |
| JP | 64-009869 A | 1/1989 |
| JP | 64-040586 A | 2/1989 |
| JP | 03-009552 A | 1/1991 |
| JP | 06-100367 A | 4/1994 |
| JP | 6-100367 A | 4/1994 |
| JP | 07-109171 A | 4/1995 |
| JP | 09-102562 A | 4/1997 |
| JP | 09-283955 A | 10/1997 |
| JP | 10-168502 A | 6/1998 |
| JP | 11-001621 A | 1/1999 |
| JP | 2000-323633 A | 11/2000 |
| JP | 2001-068608 A | 3/2001 |
| JP | 2002-299534 A | 10/2002 |
| JP | 2002-308611 A | 10/2002 |
| JP | 2002-363421 A | 12/2002 |
| JP | 2003-105108 A | 4/2003 |
| WO | WO 98/45224 | 10/1998 |
| WO | WO 2005019131 A1 * | 3/2005 |

* cited by examiner (a)

(b)

HIGH THERMAL CONDUCTIVE ELEMENT, METHOD FOR MANUFACTURING SAME, AND HEAT RADIATING SYSTEM

RELATED APPLICATIONS

This Application is a Divisional of U.S. Ser. No. 11/242,907, filed Oct. 5, 2005, which is a Continuation of International Application No. PCT/JP2004/012671 filed on Aug. 26, 2004, which in turn claims the benefit of Japanese Application No. 2003-300892, filed on Aug. 26, 2003, Japanese Application No. 2003-353443, filed on Oct. 14, 2003, and Japanese Application No. 2004-082235, filed on Mar. 22, 2004, the entire contents of each of which are hereby incorporated by reference.

FIELD OF THE INVENTION

This invention relates to a high thermal conductive element whose main component is carbon (C), and to a method for manufacturing this member. The present invention further relates to a heat radiating system (heat radiating apparatus) that includes this high thermal conductive element.

More specifically, the present invention relates to an improved thermally conductive member composed of a graphite structure having anisotropy in its degree of thermal conductivity, wherein this high thermal conductive element has relatively high thermal conductivity in its c axial direction while also retaining high thermal conductivity in a direction perpendicular to the c axial direction.

BACKGROUND ART OF THE INVENTION

As the performance and density of electronic devices have risen in recent years, while the size of these devices has decreased, an issue has been how to efficiently radiate the heat generated from these devices and the electronic components of which they are made up. The need to deal with this heat is particularly acute with semiconductor lasers and CPUs, which are the heart of computers.

For cooling to be carried out efficiently, there needs to be a good combination of convection, radiation, conduction, and so forth. When cooling the above-mentioned electronic components, it is effective to cool them by transferring the heat to a lower-temperature region primarily by thermal conduction.

Heat radiating materials composed of metals with high thermal conductivity, such as copper (Cu) or aluminum (Al), are often used as the heat radiating means for electronic devices, electronic components, and so forth.

However, as elements are being made increasingly smaller, or generate more heat, it is becoming impossible to deal with this problem with conventional heat radiating materials. Consequently, there is a need for the development of a high thermal conductivity member with better thermal conductivity. The development of high thermal conductivity members with greater freedom of geometrical shape is also to be desired.

In light of this situation, graphite, which is composed of carbon (C), holds much promise as a replacement for the above-mentioned heat radiating materials, because it has outstanding heat resistance, chemical resistance, electrical conductivity, and so on, and also has high thermal conductivity.

FIG. 4 shows the crystal structure of graphite. More specifically, graphite has a structure made up of layered six-membered ring planar structures (graphene layers) 7 composed of six carbon (C) atoms. Because of this crystal structure, graphite is characterized by two directions, namely, a direction perpendicular to the graphene layers (c axial direction), and a direction parallel to the graphene layers (a-b axial directions, that is, directions perpendicular to the c axis).

For instance, in an ideal graphite crystal, the thermal conductivity $\kappa\perp$ in a direction perpendicular to the graphene layers 7 (the c axial direction, hereinafter also referred to as the "layer direction" (thickness direction)) is not very high (10 W/m·k or less). In contrast, the thermal conductivity $\kappa\|$ in a direction parallel to the graphene layers 7 (the a-b axial directions, hereinafter also referred to as the "planar direction") is over 1000 W/m·k. Such thermal conductivity is more than twice that of copper ($\kappa$ (Cu) ~350-400 W/m·k), and more than four times that of aluminum ($\kappa$ (Al) ~200-250 W/m·k). Actually, it has been reported that $\kappa\|$=about 200 to 900 W/m·k with monocrystalline graphite, and $\kappa\|$=about 50 to 400 W/m·k with other graphite materials. Accordingly, various thermally conductive graphite materials that take advantage of high thermal conductivity in this planar direction have already been proposed.

For example, there have been reports of thermally conductive members whose thermal conduction characteristics have been improved by dispersing graphite powder in a polymer matrix or a silicone resin (Japanese Published Patent Applications S61-145266, H01-040586, H03-009552, H09-102562, H09-283955, 2002-299534, 2002-363421, 2003-105108, etc.). FIG. 10 is a simplified diagram of these thermally conductive members that have been disclosed (Conventional Example 1). In Conventional Example 1, it has been reported that thermal conductivity can be improved ($\kappa$~several tens W/m·k) by dispersing and orienting a graphite powder 12 with high thermal conductivity in the planar direction in a polymer or other matrix 11.

A member produced by the compression molding of graphite flakes along with a polymer binder has also been reported (Japanese Published Patent Applications H01-009869 and H11-001621). Further, there has been a report of a member produced by hot pressing the product of compounding a metal powder and a crystalline carbon material (Japanese Published Patent Application H10-168502). FIG. 11 is a simplified diagram of these thermally conductive members that have been disclosed (Conventional Example 2). In Conventional Example 2, a thermally conductive member 13 ($\kappa$=400 to 970 W/m·k) composed of graphite with high thermal conductivity is produced by compression molding a graphite powder 14 (or mixture of metal and graphite powder) with high thermal conductivity in the planar direction.

Sheet-form thermally conductive members composed of just graphite with high in-plane orientation are also known (Japanese Published Patent Applications S58-147087, S60-012747, and H07-109171). FIG. 12 is a simplified diagram of the thermally conductive members disclosed in these publications (Conventional Example 3). With Conventional Example 3, an organic polymer sheet is baked, which provides a thermally conductive member ($\kappa$=600 to 1000 W/m·k) composed of a graphite structure with extremely high in-plane orientation.

Thus, thermally conductive members that make use of graphite as a thermally conductive substance are characterized by superior thermal conductivity, freedom of shape, and so forth as compared to conventional members made up of copper (Cu) or aluminum (Al).

DISCLOSURE OF THE INVENTION

However, the following problems are encountered with conventional thermally conductive members in which graphite is used.

According to the constitution of Conventional Example 1, thermal conductivity can be improved because the graphite powder 12 having high thermal conductivity is dispersed in the matrix 11. Nevertheless, since the thermal conductivity of the matrix 11 itself, which is composed of a resin or polymer, is low, it is difficult to obtain an overall high level of thermal conductivity. Specifically, the limit to thermal conductivity is very roughly 20 to 30 W/m·k, which is inadequate in terms of the performance that will be required in the future.

Furthermore, with Conventional Example 1, since thermal characteristics are improved by dispersing graphite in the low thermal conductivity matrix 11, the graphite powder 12 has to be used in a relatively large proportion of the whole, and there is a corresponding decrease in moldability.

With the constitution in Conventional Example 2, since the main component of the member 13 is the graphite powder 14 with high thermal conductivity, thermal conductivity is indeed improved in the planar direction, but because of inadequate orientation and the effect of contact thermal resistance between the particles, the high thermal conductivity originally had by the graphite is not fully realized.

Also, with Conventional Example 2, the compression molding provides in-plane orientation to the graphite particles 14, so it is difficult to improve the thermal conductivity in the layer direction.

Furthermore, with Conventional Example 2, because the powder generally has to be compression molded, there are problems in terms of freedom of shape and ease of production.

With the constitution of Conventional Example 3, the thermal conductivity is extremely high in the planar direction because the material consists of monocrystalline graphite with extremely high in-plane orientation. As mentioned above, though, the crystal structure of graphite is very anisotropic, which means that the thermal conductivity in the layer direction is several dozen times lower. Accordingly, while this thermally conductive member does offer extremely high performance as long as it is used only for the purpose of transmitting heat in the planar direction of the member, its thermal conductivity characteristics, including those in the layer direction, will need to be improved to accommodate the future trend toward higher performance and density in devices and their components.

Therefore, it is an object of the present invention to provide a high thermal conductive element that takes advantage of the high thermal conductivity of graphite in the planar direction, while also exhibiting higher thermal conductivity in the layer direction.

As a result of diligent research aimed at solving the above problems encountered with prior art, the inventors arrived at the present invention upon discovering that the stated object was achieved by a carbon material having a specific structure.

Specifically, the present invention relates to the following high thermal conductive element, and method for manufacturing the element, and a heat radiating system that makes use of the element.

1. A high thermal conductive element comprising a graphite-based matrix and carbon particles dispersed in the graphite-based matrix, wherein (1) the c axis of the graphene layers constituting the graphite are substantially parallel, (2) the thermal conductivity $\kappa\|$ in a direction perpendicular to the c axis is at least 400 W/m·k and no more than 1000 W/m·k, and (3) the thermal conductivity $\kappa\perp$ in a direction parallel to the c axis is at least 10 W/m·k and no more than 100 W/m·k.

2. The high thermal conductive element according to above 1, wherein the high thermal conductive element is in the form of a film, and the c axis is substantially parallel to the thickness direction of the film.

3. The high thermal conductive element according to above 2, wherein the thickness of the film is at least 10 μm and no more than 300 μm.

4. The high thermal conductive element according to above 2, wherein the high thermal conductive element is flexible.

5. The high thermal conductive element according to above 1, wherein the graphite-based matrix indicates an X-ray diffraction pattern having one or more peaks for the (002$n$) plane wherein n is a natural number.

6. The high thermal conductive element according to above 1, wherein the graphite-based matrix indicates an X-ray diffraction pattern having peaks for the (002) plane and the (004) plane.

7. The high thermal conductive element according to above 1, wherein pores are present in the interior of the graphite-based matrix.

8. The high thermal conductive element according to above 1, wherein the density of the high thermal conductive element is at least 0.3 g/cm$^3$ and no more than 2 g/cm$^3$.

9. The high thermal conductive element according to above 1, wherein the carbon particles are contained in an amount of at least 10 weight ppm and no more than 10 wt %.

10. The high thermal conductive element according to above 1, wherein the carbon particles are at least one selected from the group consisting of 1) graphite particles and 2) a carbon structure other than graphite.

11. The high thermal conductive element according to above 10, wherein the carbon structure is at least one selected from the group consisting of carbon nanotube, fullerene, diamond, and diamond-like carbon.

12. The high thermal conductive element according to above 1, wherein all or part of the carbon particles is graphite.

13. The high thermal conductive element according to above 1, wherein the average particle size of the carbon particles is at least 0.05 μm.

14. The high thermal conductive element according to above 1, wherein the average particle size of the carbon particles is at least 0.05 μm and no more than 20 μm.

15. The high thermal conductive element according to above 1, wherein the carbon particles are in the form of flakes.

16. A method for manufacturing a high thermal conductive element comprising a graphite-based matrix and carbon particles dispersed in the graphite-based matrix, the method comprising:

(1) a first step of preparing a mixture comprising a raw material capable of forming an organic polymer, and at least one type of dispersed particles selected from the group consisting of carbon particles and precursor particles thereof;

(2) a second step of forming a coating film in which the particles are dispersed in the organic polymer using the mixture; and (3) a third step of obtaining the high thermal conductive element by heat treating the coating film.

17. The manufacturing method according to above 16, wherein all or part of the dispersed particles is at least one carbon structure selected from the group consisting of carbon nanotube, fullerene, diamond, and diamond-like carbon.

18. The manufacturing method according to above 16, wherein all or part of the carbon particles is graphite.

19. The manufacturing method according to above 16, wherein the organic polymer is polyimide.

20. The manufacturing method according to above 16, wherein the mixture is a mixture comprising a polyamic acid solution and at least one selected from the group consisting of carbon particles and precursor particles thereof.

21. The manufacturing method according to above 20, wherein the method further comprises a step of imidizing the polyamic acid.

22. The manufacturing method according to above 16, wherein the precursor particles are polyimide.

23. The manufacturing method according to above 19, wherein the heat treatment comprises 1) a pre-heating step of heating at a temperature of at least 1000° C. and no more than 1500° C. and 2) a main heating step of heating at a temperature of at least 2000° C. and no more than 3000° C.

24. A heat radiating system including a heating source, a heat radiating member, and a high thermal conductive element, wherein (1) the heating source and the heat radiating member are thermally connected via the high thermal conductive element, and (2) the high thermal conductive element is the high thermal conductive element according to above 1.

25. The heat radiating system according to above 24, wherein the high thermal conductive element is in the form of a film.

26. The heat radiating system according to above 25, wherein at least one selected from the group consisting of the heating source and the heat radiating member is disposed in contact with the surface of the film.

27. The heat radiating system according to above 24, wherein the high thermal conductive element is flexible.

28. The heat radiating system according to above 24, wherein the high thermal conductive element has one or more curved portions.

29. The heat radiating system according to above 24, wherein the heat radiating member is a cooling fin.

Figure 1:
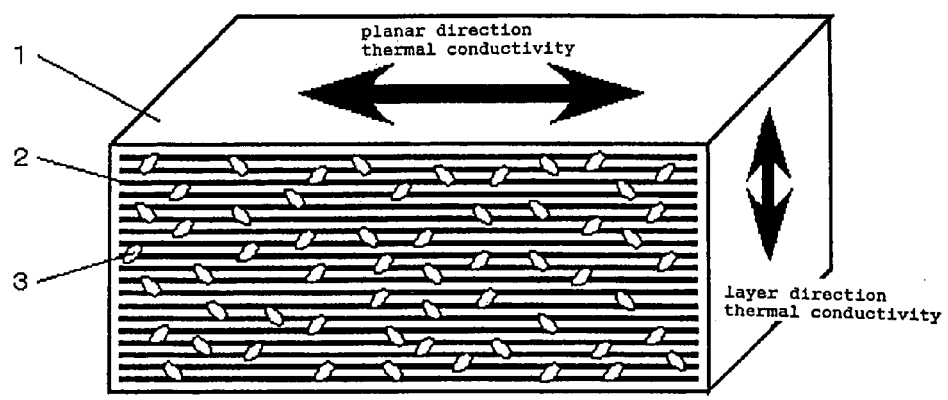
FIG. 1 is a simplified diagram of the high thermal conductive element of the present invention.

LIST OF ELEMENTS 1 graphite structure
2 graphene layer
3 graphite particle
4 pore
5 highly oriented graphite flake
6 carbon atom
7 graphene layer
8 heating element
9 high thermal conductive element
10 heat radiating member
11 matrix
12 graphite particle
13 compression molded graphite
14 graphite particle
15 highly oriented graphite sheet
16 graphene layer

BEST MODE FOR CARRYING OUT THE INVENTION

1. High Thermal Conductive Element

The high thermal conductive element of the present invention is a high thermal conductive element in which carbon particles are dispersed in a graphite-based matrix, wherein (1) the c axes of the various graphene layers constituting the graphite are substantially parallel, (2) the thermal conductivity $\kappa\|$ in a direction perpendicular to the c axis is at least 400 W/m·k and no more than 1000 W/m·k, and (3) the thermal conductivity $\kappa\perp$ in a direction parallel to the c axis is at least 10 W/m·k and no more than 100 W/m·k.

The graphite-based matrix of the present invention has a basically graphite structure. Specifically, the basic structure consists of stacked graphene layers composed of a plurality of carbon six-membered rings. Therefore, the c axes of the various graphene layers in the graphite-based matrix are substantially parallel. The graphite-based matrix need not have a completely graphite structure, though. At the least, the graphite-based matrix indicates an X-ray diffraction pattern having one or more peaks for the (002″) plane (where n is a natural number). It is particularly favorable that the graphite-based matrix indicates an X-ray diffraction pattern having at least peaks for the (002) plane and (004) plane.

In terms of being close to a completely graphite structure, it is preferable for the graphite-based matrix to have one or more peaks for the (002″) plane (where n is a natural number) present in the X-ray diffraction pattern, and for no other peaks to appear.

It is also preferable for the graphite-based matrix to be such that when evaluated by X-ray diffraction, its interplanar spacing (d) is at least 0.335 nm and no more than 0.340 nm. The reported value for monocrystalline graphite is 0.335 nm.

It is also preferable for pores to be included in the interior of the graphite-based matrix. The presence of pores allows the density of the high thermal conductive element of the present invention to be lower than that originally had by graphite (~2.26 g/cm$^3$). Specifically, the density of the high thermal conductive element of the present invention is preferably at least 0.3 g/cm$^3$ and no more than 2 g/cm$^3$, with a range of at least 0.6 g/cm$^3$ and no more than 1.5 g/cm$^3$ being particularly favorable.

With the present invention, carbon particles are dispersed in the above-mentioned matrix. The function of these carbon particles is to thermally connect the graphene layers together so that heat propagates through the graphite-based matrix in the layer direction (thickness direction) as well, rather than in just the planar direction.

Therefore, there are no particular restrictions on the type of carbon particles as long as they have the above-mentioned function. With the present invention, it is particularly favorable for the carbon particles to consist of 1) graphite particles and/or 2) a carbon structure other than graphite (carbon structure particles).

It is preferable to use graphite with high thermal conductivity (particularly graphite with high crystallinity) as the graphite particles that serve as the dispersed material. For instance, it is possible to use a) natural graphite, b) synthetic graphite obtained by pyrolyzing a hydrocarbon or other such carbon-containing gas, c) highly oriented pyrolytic graphite (so-called "HOPG") obtained by annealing this synthetic graphite, or the like. These can be used singly or in combinations of two or more types.

Any graphite particles (graphite powder) can be used as the dispersed material as long as they have relatively high thermal conduction characteristics as discussed above. Whether or not graphite particles are suitable can be ascertained directly from their degree of thermal conductivity, or indirectly from their crystallinity as evaluated by X-ray diffraction or the like. For example, when X-ray diffraction is used for this purpose, a material whose interplanar spacing is between 0.335 and 0.340 nm can be used, just as with the above-mentioned graphite-based matrix.

Graphite particles can be obtained by subjecting graphite to a suitable treatment such as pulverization. There are no restrictions on how this pulverization treatment is carried out, and any known apparatus may be used, such as a ball mill, jet mill, or high speed rotary mill. Pulverizing is particularly easy with a jet mill. In this pulverization treatment, uniformity of the particle size can be increased by using a particle size gauge or the like. In addition, grading may be performed according to a standard method as needed after pulverization.

The carbon structure (particles) serving as the dispersed material is preferably a carbon structure having high thermal conductivity (in particular, a carbon structure with high crystallinity), just as with the graphite particles. For example, it is possible to use single-wall carbon nanotube (SWNT), multi-wall carbon nanotube (MWNT), or other such carbon nanotube, as well as carbon nanocoil (CNC), fullerene, natural diamond, high-pressure synthetic diamond, implosion synthetic diamond, vapor phase synthetic diamond, or the like. These can be used singly or in combination of two or more types. Of these, the use of one or more of carbon nanotube, fullerene, diamond, and diamond-like carbon is preferable in terms of achieving a fairly consistent shape or size. The above-mentioned carbon nanotube encompass carbon nanohorn.

If the carbon structure is large in size, it can be pulverized into smaller particles as needed. The advantage to this is better dispersion in the graphite-based matrix. The method for pulverizing a large-sized carbon structure can be the same as that used for the above-mentioned pulverization of the graphite.

With the present invention, of these various carbon particles, it is particularly favorable for all or part of the carbon particles to be graphite.

The amount in which the carbon particles are contained can be suitably determined according to the desired thermal conductivity, the type of carbon particles, and other such factors. In general, a range of at least 10 weight ppm but no more than 10 wt % is preferred, and a range of at least 1000 weight ppm but no more than 7 wt % is particularly favorable.

The size of the carbon particles can be set according to the desired thermal conductivity and other such factors. Usually, the average particle size is at least 0.05 µm, with a range of at least 0.05 µm and no more than 20 µm being preferred, and a range of at least 0.1 µm and no more than 4 µm being particularly favorable.

There are no restrictions on the shape of the carbon particles, which may be spherical, amorphous, flakes, fibrous, or the like. It is particularly favorable with the present invention for the above-mentioned carbon particles to be in the form of flakes. The thermal conductivity of the dispersed carbon particles can be utilized more efficiently when the carbon particles are in the form of flakes, so on the whole the thermal conductivity in the layer direction will be much higher.

With the high thermal conductive element of the present invention, the thermal conductivity $\kappa\|$ in a direction perpendicular to the c axis is preferably at least 400 W/m·k and no more than 1000 W/m·k, with a range of at least 700 W/m·k and no more than 1000 W/m·k being particularly favorable.

The thermal conductivity $\kappa\perp$ in a direction parallel to the c axis is at least 10 W/m·k and no more than 100 W/m·k, with a range of at least 50 W/m·k and no more than 100 W/m·k being particularly favorable.

There are no particular restrictions on the shape of the high thermal conductive element of the present invention, but it is preferably a film (sheet). If the high thermal conductive element is in the form of a film, its thickness can be suitably determined according to the intended use and application, but a range of at least 10 µm and no more than 300 µm is generally preferred.

If the high thermal conductive element is in the form of a film, it is preferable for the c axis of the graphite-based matrix to be substantially parallel to the thickness direction of the film. In other words, it is preferable for the graphene layers of the graphite-based matrix to be arranged so that the c axis is substantially perpendicular to the film plane (main plane).

The result of this is that the thermal conductivity $\kappa\perp$ can be kept within the above-mentioned range of at least 10 W/m·k and no more than 100 W/m·k as the thermal conductivity in the thickness direction. Specifically, this affords a high thermal conductive element having excellent thermal conductivity in the thickness direction as well. In this case, the thermal conductivity $\kappa\|$ in the film plane (main plane) direction is at least 400 W/m·k and no more than 1000 W/m·k.

It is preferable for the high thermal conductive element of the present invention (and particularly a film-form high thermal conductive element) to be flexible. Specifically, it is preferable for the member to be bendable. This affords greater design freedom, and allows the product to be used in a wide range of applications.

Flexibility, as referred to in this Specification, indicates flexural resistance with respect to a bending treatment. Flexibility can be freely controlled by means of the shape of the pores, the thickness of the high thermal conductive element, the type of carbon particles, and so forth. In particular, if the member of the present invention includes pores, there is a marked increase in the number of flexing cycles.

2. Method for Manufacturing the High Thermal Conductive Element

There are no restrictions on how the high thermal conductive element of the present invention is produced, but the following manufacturing method is preferable.

This is a method for manufacturing a high thermal conductive element in which carbon particles are dispersed in a graphite-based matrix, comprising:

(1) a first step of preparing a mixture of a raw material capable of forming an organic polymer, and at least one type of dispersed particles selected from among carbon particles and precursor particles thereof;

(2) a second step of using this mixture to form a film in which the particles are dispersed in the organic polymer; and (3) a third step of obtaining the high thermal conductive element by heat treating the film.

First Step

In the first step, a mixture is prepared from a raw material capable of forming an organic polymer, and carbon particles and/or precursor particles thereof.

The raw material capable of forming an organic polymer may be one capable of forming a highly oriented graphite structure by the heat treatment in the third step. Examples include polyimide (PI), polyamide (PA), polyphenylene terephthalamide (PPTA), polyphenylene oxadiazole (POD), polybenzothiazole (PBT), polybenzobisthiazole (PBBO), polyphenylene benzoimidazole (PBI), polyphenylene benzobisimidazole (PPBI), polythiazole (PT), polyparaphenylenevinylene (PPV), polyamide-imide, and polyacrylonitrile. Of these, a polyimide is preferred.

With the present invention, in addition to using these organic polymers directly as the raw material, their precursors can also be used as the above-mentioned raw material. For instance, if the object of the second step is forming a polyimide film, it is possible to use polyamic acid, which is a polyimide precursor, as the raw material.

With the present invention, in addition to an organic polymer solution obtained by dissolving one of the various organic polymers listed above in a solvent, the above-mentioned raw material can also be a reaction product obtained by reacting the monomers that constitute an organic polymer, for example.

The dispersed particles are carbon particles and/or precursor particles thereof.

These carbon particles can be the same as the carbon particles listed above. The use of 1) graphite particles and/or 2) a carbon structure other than graphite is particularly favorable.

The precursor of carbon particles may be a type that turns into carbon particles (and preferably graphite particles) when subjected to heat treatment. Examples include polyimide (PI), polyamide (PA), polyamide-imide, polyphenylene terephthalamide (PPTA), polyphenylene oxadiazole (POD), polybenzothiazole (PBT), polybenzobisthiazole (PBBO), polyphenylene benzoimidazole (PBI), polyphenylene benzobisimidazole (PPBI), polythiazole (PT), polyparaphenylenevinylene (PPV), and polyacrylonitrile (PAN). Of these, a polyimide is preferred. These can be known or commercially available compounds. For example, when a polyimide is used, "Kapton," which is a powdered product made by Toray-DuPont, can be used favorably. Also, polymer fibers several micrometers in diameter that have been cut to a length of anywhere from several micrometers to several tens micrometers can be used.

A suitably solvent can be used in the preparation of the mixture in the first step. It is particularly favorable with the present invention for a solution obtained by dissolving one of the various organic polymers listed above, or a precursor thereof, in a solvent to be used as the raw material capable of forming an organic polymer. Such a solution encompasses solutions of reaction products obtained by reacting monomers capable of forming an organic polymer.

The above-mentioned solvent is preferably capable of dissolving these organic polymers, etc. For instance, one may be suitably selected, according to the type of organic polymer to be obtained and other such factors, from among standard organic solvents such as dimethylacetamide and N-methylpyrrolidone. These solvents can be used singly or in mixtures of two or more types.

Suitable known additives can also be added as needed to the above mixture. Examples include a viscosity regulator such as ethylene glycol, and a filler such as calcium hydrogenphosphate for reducing the electrical charging of the organic polymer that is formed.

The concentrations of the various components in the mixture may be suitably set so as to obtain the high thermal conductive element defined in item 1. above. There are no particular restrictions on the solids concentration of the liquid mixture, as long as the various components can be uniformly mixed, but this concentration is generally set within a range of at least 5 ppm and no more than 5 wt %.

Second Step

In the second step, the above mixture is used to form a film in which the above-mentioned particles are dispersed in the above-mentioned organic polymer.

There are no limitations on how the film is formed, but a film can be formed, for example, by coating a suitable substrate with the above-mentioned mixture. This coating can be accomplished by brushing, spraying, doctor blade, or roller, or by a standard printing method. Nor are there any limitations on the type of substrate, but examples include substrates made of metals and/or alloys, plastic, and ceramic. It is therefore possible to directly coat a heat radiating member or the like as the substrate.

There are no limitations on the thickness of the film, but when a film-form high thermal conductive element is to be manufactured, the coating thickness can be suitably adjusted so as to achieve the desired film thickness. For instance, it can be adjusted so that the thickness of the resulting film is at least 10 μm and no more than 300 μm. In this case, two, three, or more layers of coating film may be applied as needed.

When a precursor of an organic polymer is used as the raw material in the first step, it can be converted into the desired organic polymer by performing a specific treatment. For example, when polyamic acid, which is a polyimide precursor, is used as the raw material, a polyamic acid coating is formed from a mixture containing polyamic acid, after which the polyamic acid is imidized and converted into a polyimide film. This imidization may be accomplished by a known method. For instance, imidization can be performed by heating a polyamic acid film at a specific temperature.

Third Step

In the third step, the high thermal conductive element is obtained by heat treating the above-mentioned coating film.

The heat treatment conditions may be suitably set such that the matrix of the film will become graphite. For instance, the treatment can be carried out favorably in an inert gas atmosphere between 1000° C. and 3000° C. One or more types of inert gas can be used, such as argon, helium, or nitrogen. The heat treatment duration may be suitably set according to the heat treatment temperature and other such factors.

With the present invention, it is particularly favorable for the heat treatment to consist of two steps: 1) a pre-heating step of heating at a temperature between 1000° C. and 1500° C. and 2) a main heating step of heating at a temperature between 2000° C. and 3000° C.

In the pre-heating step, the organic polymer is heated at the above-mentioned temperature to remove components other than carbon (C) (such as oxygen (O), nitrogen (N), or hydrogen (H)) contained in the organic polymer.

The heat treatment duration in this case will vary with the shape and size of the sample being baked, but is usually at least 0.5 hour and no more than 5 hours.

There are no limitations on the heating rate for going into the pre-heating step, but it is generally at least 1° C./min and no more than 15° C./min, with a range of at least 3° C./min and no more than 10° C./min being particularly favorable. Nor is the cooling rate after the pre-heating treatment limited, but cooling is usually performed at a rate of at least 5° C./min and no more than 20° C./min, with a range of at least 5° C./min and no more than 10° C./min being particularly favorable.

The effect of performing the pre-heating step under the above conditions is that the planar direction thermal conductivity and orientation are increased in the graphite structure obtained after the subsequent main heating treatment.

The main heating step is performed at a specific temperature selected from a range of 2000 to 3000° C. in order to obtain graphite with better orientation. The orientation of the graphite-based matrix ultimately obtained can be further improved by conducting an intermediate treatment in which the coating film is first held at a specific heating temperature (roughly between at least 2000° C. and no more than 2400° C.).

The heat treatment duration in this case will vary with the shape and size of the sample being baked, but is usually at least 0.5 hour and no more than 10 hours.

There are no limitations on the heating rate for going into the main heating step, but it is generally at least 5° C./min and no more than 15° C./min, with a range of at least 5° C./min and no more than 10° C./min being particularly favorable. Nor is the cooling rate after the main heating treatment limited, but cooling is usually performed at a rate of at least 5° C./min but no more than 20° C./min, with a range of at least 5° C./min but no more than 10° C./min being particularly favorable.

3. Heat Radiating System

The present invention encompasses a heat radiating system (heat radiating apparatus) including a heating source, a heat radiating member, and a high thermal conductive element, wherein (1) the heating source and the heat radiating member are thermally connected via the high thermal conductive element, and (2) the high thermal conductive element is the high thermal conductive element according to Claim 1.

Figure 9:
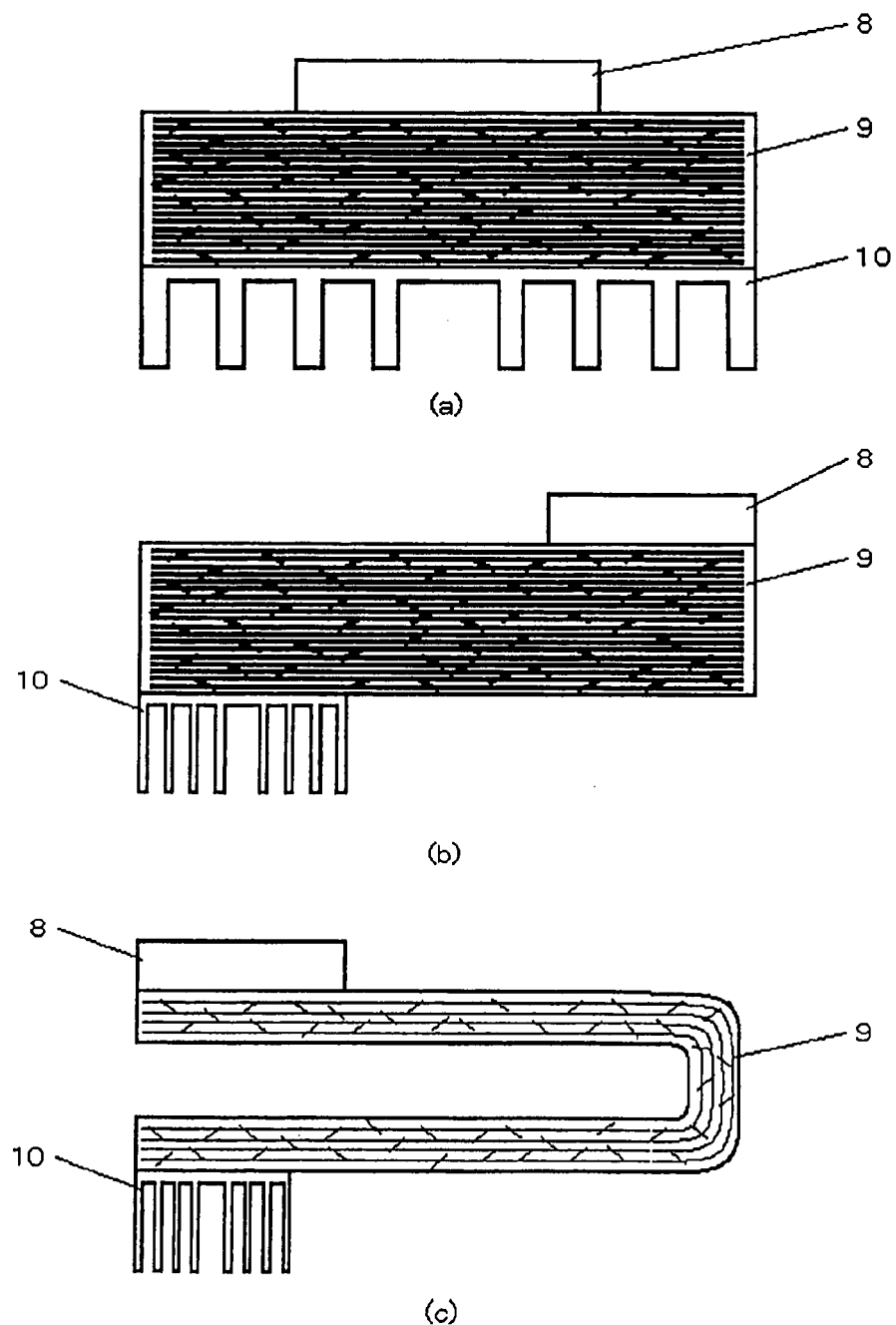
FIG. 9 consists of simplified diagrams of a heat radiating system in which the high thermal conductive element of the present invention is used.
Figure 10:
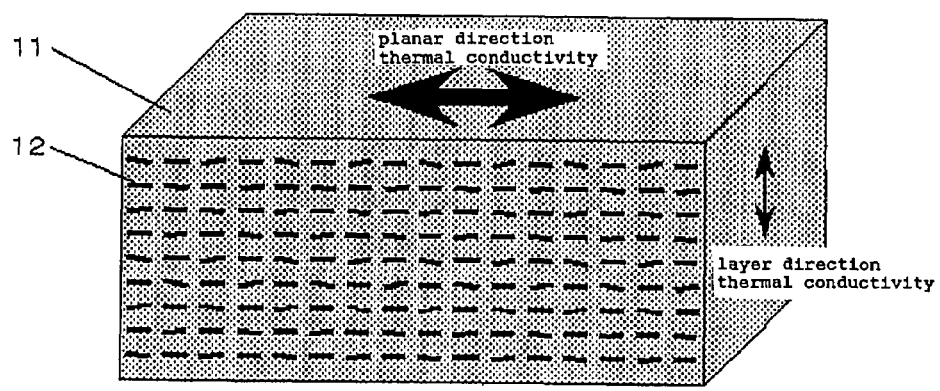
FIG. 10 is a simplified diagram of a conventional high thermal conductive element (Conventional Example 1)
Figure 11:
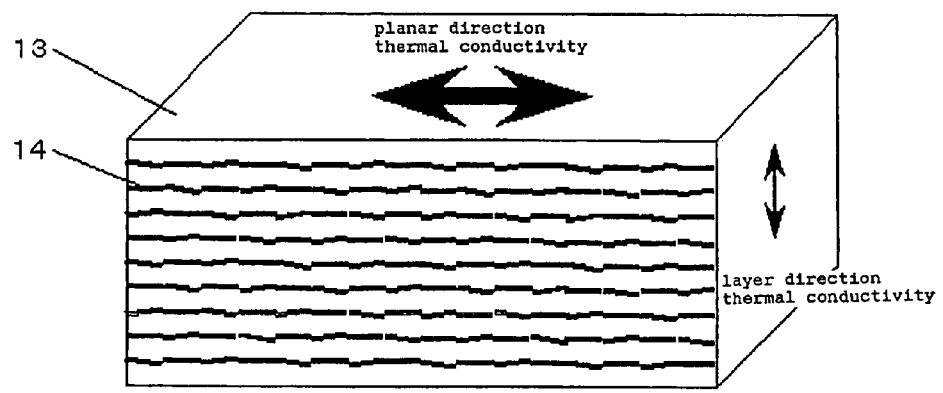
FIG. 11 is a simplified diagram of a conventional high thermal conductive element (Conventional Example 2)
Figure 12:
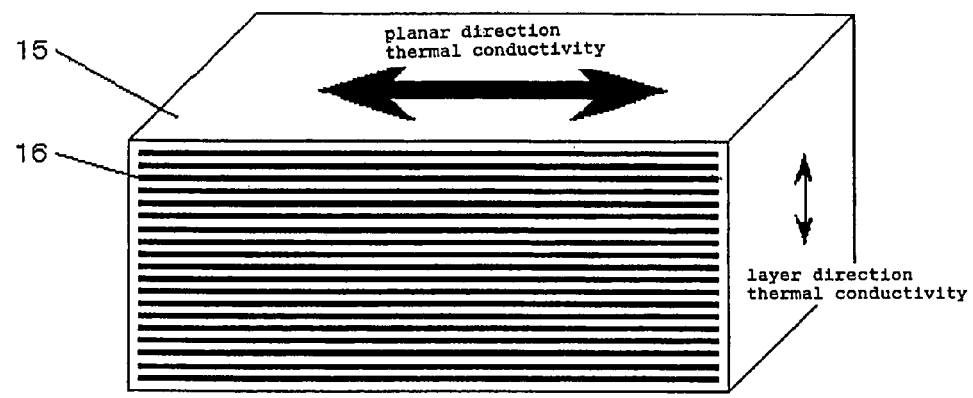
FIG. 12 is a simplified diagram of a conventional high thermal conductive element (Conventional Example 3).

The heat radiating system of the present invention can be used for various types of conventional electronic device or components thereof where heat management is necessary. Specifically, the system of the present invention can be used in place of the heat radiating system of a conventional apparatus. For example, as shown in FIGS. 9(a) to 9(c), when cooling fins are employed as the heat radiating members, efficient heat radiation (cooling) can be accomplished by interposing the high thermal conductive element between the cooling fins and the heating source.

With the present invention, the high thermal conductive element may be thermally connected to the heating source and the heat radiating member. Specifically, the configuration may be such that heat is efficiently transferred from the heating source to the high thermal conductive element, and from the high thermal conductive element to the heat radiating member. It is generally preferable for the high thermal conductive element to be in direct contact with the heating source and the heat radiating member.

There are no limitations on the size, shape, layout, and so forth of the heating source, high thermal conductive element, and heat radiating member, and these can be suitably set so as to achieve efficient heat radiation.

With the heat radiating system of the present invention, when a film-form high thermal conductive element is used, the film plane (main plane) is usually disposed so as to be in contact with the heating component or the heat radiating member. For instance, the heating component or the heat radiating member can be disposed so as to be in contact with the film plane as shown in FIGS. 9(a) to 9(c).

With the present invention, when a flexible high thermal conductive element is used, the heat radiating system can be designed to accommodate the shape of the heating source, the installation site, and so forth. For instance, as shown in FIG. 9(c), the heat radiating system can have one or more bent sections. This allows a heat radiating system to be constructed with a high degree of design freedom.

Embodiments of the present invention will now be described through reference to the drawings.

Embodiment 1

FIG. 1 is a simplified diagram of the high thermal conductive element in Embodiment 1 of the present invention.

The main constituent elements of this high thermal conductive element are a graphite structure 1 whose c axis is oriented substantially parallel to the thickness direction, and graphite particles 3 that are dispersed substantially uniformly in the graphite structure 1.

Figure 4:
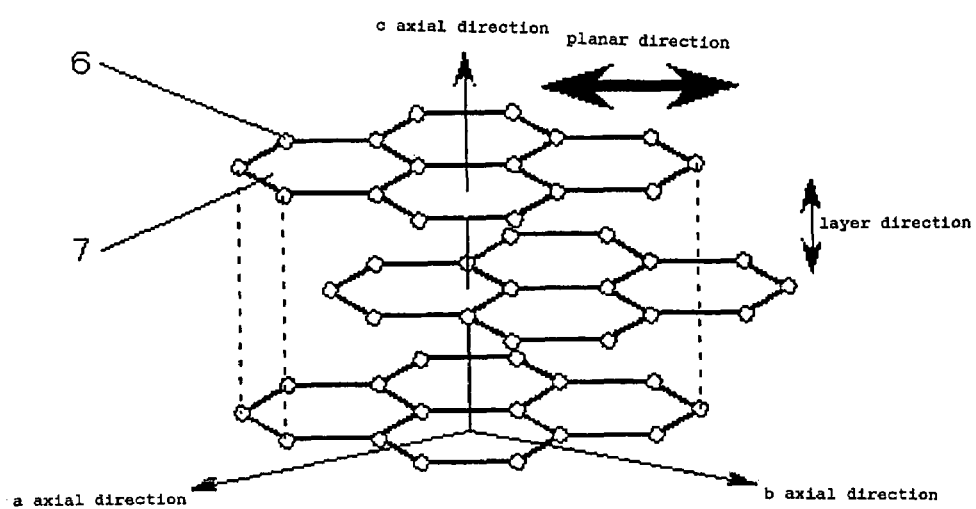
FIG. 4 is a diagram of the crystal structure of graphite.

This graphite structure 1 consists of interdependently stacked graphene layers 2 composed of carbon six-membered ring structures, as mentioned above. Specifically, an inherent property of graphite is that the graphene layers are not merely stacked, but are stacked in predetermined positions (see FIG. 4), and this positional relationship is maintained in the stacking.

It is preferable to use a graphite structure (graphite-based matrix) 1 with which evaluation by X-ray diffraction reveals a interplanar spacing d within a range of d=0.335 to 0.340 nm, and in which the (002) plane and the high-order peak thereof are observed, and no other diffraction peaks are observed.

Figure 5:
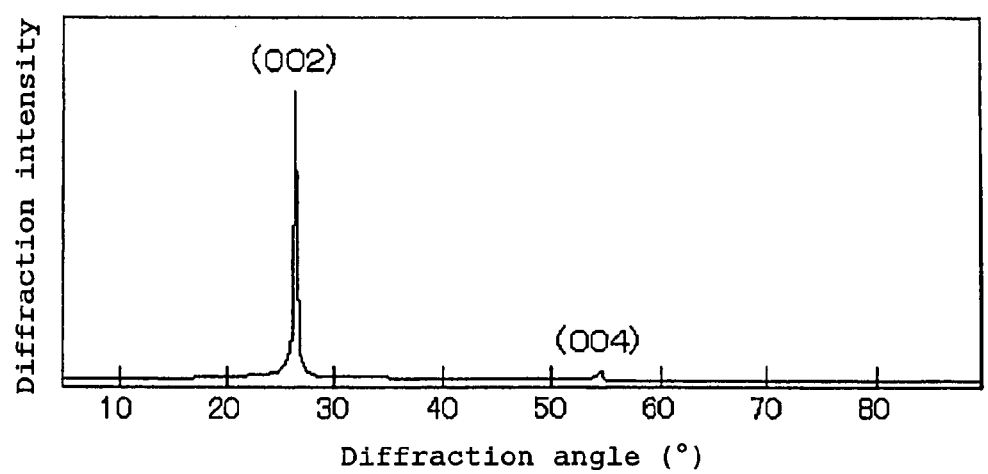
FIG. 5 is a graph of the typical X-ray diffraction pattern of an oriented graphite structure.

FIG. 5 is a graph of the typical X-ray diffraction pattern of the graphite structure 1. As for the crystallinity (orientation) of the graphite, it is preferable to use a graphite whose half band width is 1° or less with respect to the main peak near 26.5° as shown in FIG. 5. Specifically, half band width is correlated to crystallinity, and in the present invention, the narrower the half band width, the better. The thermal conductivity $\kappa\|$ in the planar direction of the graphite structure 1 itself having such crystallinity (orientation) will vary with the manufacturing method and other factors, but is roughly 400 W/m·k or higher. It is preferable in the present invention for the thermal conductivity $\kappa\|$ in the planar direction to be at least 400 W/m·k.

The graphite structure 1 used as the matrix in the present invention can be any type as long as it is graphite with high thermal conductivity in the planar direction. Graphite obtained by heating and pyrolyzing an organic polymer (such as a polyimide) that is a carbon precursor is particularly favorable because of its high thermal conductivity in the planar direction, which is due to a structure close to that of a single crystal (highly oriented). Therefore, in the following examples, the description will be of this graphite structure obtained by heating an organic polymer.

The carbon particles 3 used in the present invention have the function of transmitting in the planar direction the heat propagating through the graphite structure 1, as well as thermally connecting the graphene layers 2 (that is, each of the stacked graphene layers) so that the heat also propagates in the layer direction (thickness direction). Accordingly, it is preferable for the carbon particles 3 to be a graphite powder with high thermal conductivity, that is, a graphite powder with high crystallinity.

An oriented graphite powder, which has extremely high thermal conductivity in the planar direction, is preferred as the carbon particles in the present invention. A pulverized highly-oriented graphite sheet produced by heating an organic polymer is especially favorable in terms of crystallinity (thermal conductivity) and homogeneity.

A carbon structure can also be used as the carbon particles 3. This carbon structure also has the function of thermally connecting the graphene layers 2 and propagating heat through the graphite structure 1 not only in the planar direction, but also in the layer direction (thickness direction). Therefore, it is preferable to use a carbon structure having high thermal conductivity, and particularly one with high crystallinity.

The particle size of the carbon particles 3 is not particularly critical, as long as the size allows uniform dispersion in the graphite structure. In particular, when the graphite structure is formed by heating an organic polymer, for example, it is preferable to use carbon particles between 0.1 and 5 µm in size so as not to hamper this graphitization.

In addition to using the ready-made graphite particles discussed above as carbon particles, an organic polymer that can be made into specific carbon particles (such as graphite particles) in the course of heating and graphitizing the organic polymer serving as the matrix can also be used as the raw material for the carbon particles. For example, an organic polymer (matrix) can be graphitized, and a powdered polyimide with a particle size of at least 0.1 µm and no more than 10 µm can also be graphitized, by heat treating an organic polymer in which the above-mentioned powdered polyimide is dispersed. As a result, it is possible to obtain a high thermal conductive element in which graphite particles are dispersed in a graphite structure.

Embodiment 2

The above-mentioned graphite structure 1 can be produced by several methods, but from the standpoints of ease of production, characteristics of the resulting high thermal conductive element, and so forth, it is preferable to employ a method in which the graphite structure 1 is formed by heat-treating an organic polymer.

The method for obtaining a high thermal conductive element composed of a graphite structure by using an organic polymer as the starting raw material roughly comprises (I) a step of obtaining an organic polymer in which graphite particles are dispersed, and (II) a step of heat-treating the obtained product to graphitize the organic polymer.

With the present invention, a polyimide can be used favorably as the organic polymer, for example. When the goal is a polyimide as the organic polymer, polyamic acid, which is a polyimide precursor, can be used as the raw material. In view of this, this method will be described as an example in Embodiment 2.

First, the step of forming a graphite powder-containing organic polymer (step I) will be described.

For a graphite powder-containing organic polymer, graphite particles 3 are mixed and dispersed in a specific amount in a polyamic acid solution as a first organic polymer, and this mixture is formed into a specific shape, after which a heating dehydration reaction or the like is conducted to obtain the targeted organic polymer. A catalyst can also be used here as needed.

In this case, the molecular arrangement of the organic polymer can be controlled by means of the type of organic polymer being used and other factors. More specifically, the type of organic polymer (a solid component), the type of solvent, and so forth are determined so as to obtain a material in which suitably mixed graphite particles 3 are dispersed. A catalyst, viscosity regulator, or the like is added as needed to the solution thus prepared, then stirred and put into the desired usage form by injection molding, coating, or the like. The solvent is volatilized in this state to solidify the first organic polymer solution. The temperature during production can be close to room temperature (the ordinary working temperature), but a heating can also be performed as needed to a temperature below the boiling point of the solvent.

When the first organic polymer is changed to a second organic polymer (polyimide) that will serve as a carbon precursor by means of heating dehydration or another such reaction process, this can generally be accomplished by a heat treatment in a nitrogen atmosphere or in a vacuum, or by performing a dehydration treatment with a chemical reaction. The optimal method can be suitably selected according to the type of organic polymer being formed and so forth. From the standpoint of ease of production, a method involving heating at a temperature between 100 and 400° C. is particularly favorable. If needed, a drawing treatment can be performed simultaneously in order to control the orientation of the graphite structure.

Next, in step II, oriented graphite is obtained from the graphite particle-containing organic polymer. This step itself may be basically the same as the method for heating a polymer sheet (trade name "Kapton," made by Toray-DuPont) discussed in the above-mentioned publication (Japanese Published Patent Application H07-109171).

First, the second organic polymer that serves as a carbon precursor is pre-heated to remove components other than carbon (C) (such as oxygen (O), nitrogen (N), or hydrogen (H)) contained in the organic polymer. The heat treatment temperature and duration in this case will vary with the shape and size of the sample being baked, but in general terms may be at least 1000° C. and no more than 1500° C. for at least 0.5 hour and no longer than 5 hours in an argon (Ar) or nitrogen ($N_2$) atmosphere or a mixed atmosphere thereof. It is preferable for the heating rate here to be at least 1° C./min and no more than 15° C./min, and especially at least 3° C./min and no more than 10° C./min. It is also preferable for the cooling rate after the pre-heating treatment to be at least 5° C./min and no more than 20° C./min, and especially at least 5° C./min and no more than 10° C./min.

Employing the above conditions improves the orientation and the planar thermal conductivity of the graphite structure obtained after the main heating treatment.

In order to obtain graphite that is truly oriented, the pre-heated organic polymer is subjected to main heating at a temperature selected from the range of 2000° C. to 3000° C. The orientation of the graphite structure 1 obtained here can be increased by first performing an intermediate treatment (roughly at least 2000° C. and no higher than 2400° C.) involving holding the heating temperature at a certain level. More specifically, the organic polymer is heated from room temperature to a specific intermediate temperature at a rate of at least 5° C./min and no more than 10° C./min, this temperature is maintained for 1 hour, and then the temperature is again raised and main heating is performed. The main heating conditions roughly comprise at least 0.5 hour and no longer than 10 hours at a temperature of at least 2000° C. and no higher than 3000° C. Cooling after this main heating treatment is preferably carried out at a cooling rate of at least 5° C./min and no more than 20° C./min, and especially at least 5° C./min and no more than 10° C./min.

Figure 6:
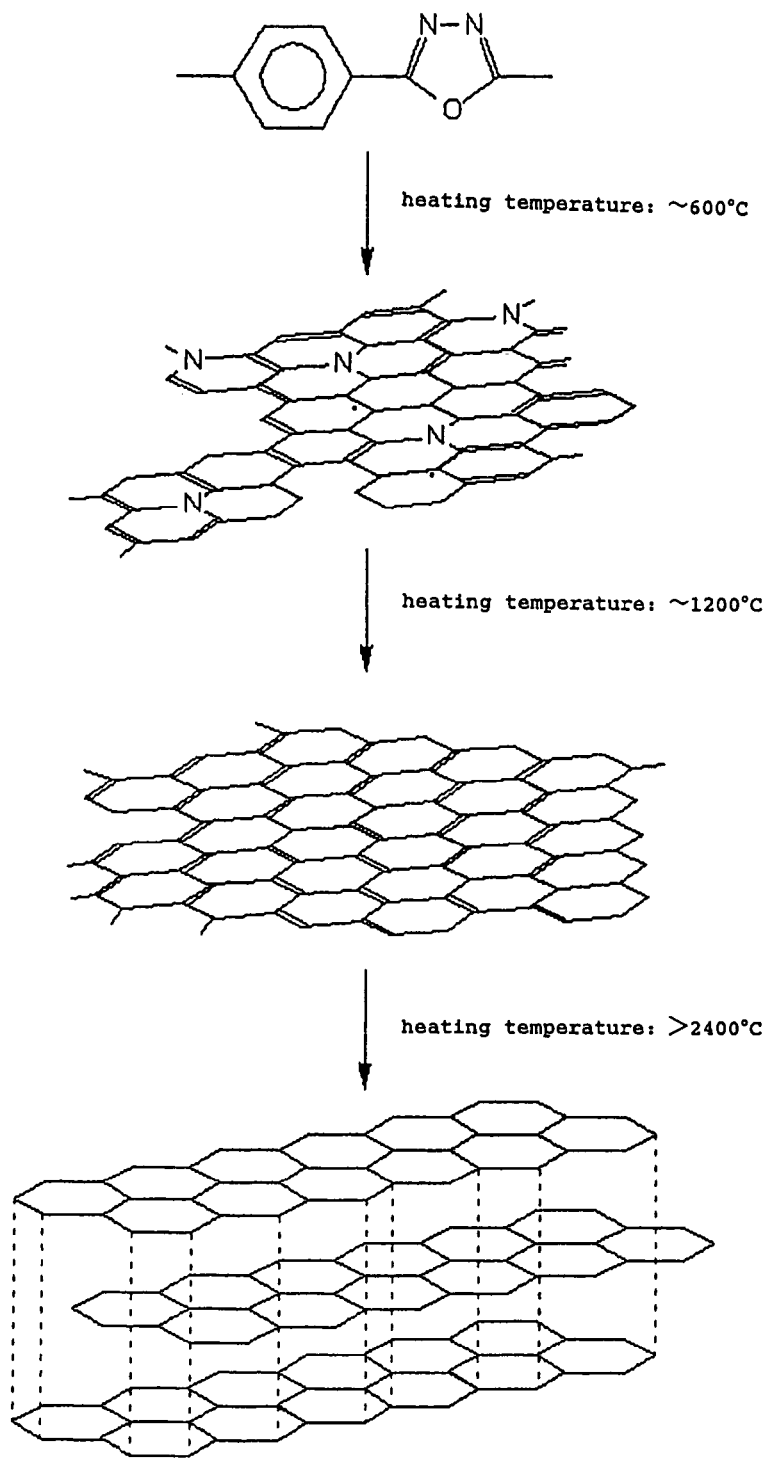
FIG. 6 is a schematic of the process of transition from an organic polymer film to an oriented graphite structure.

The above step allows the formation of the graphite structure with high planar thermal conductivity of the present invention, and thermal conductivity in the layer direction is also improved by the action of the graphite particles 3 dispersed in this structure. FIG. 6 is a schematic of the reaction in the above step.

Figure 2:
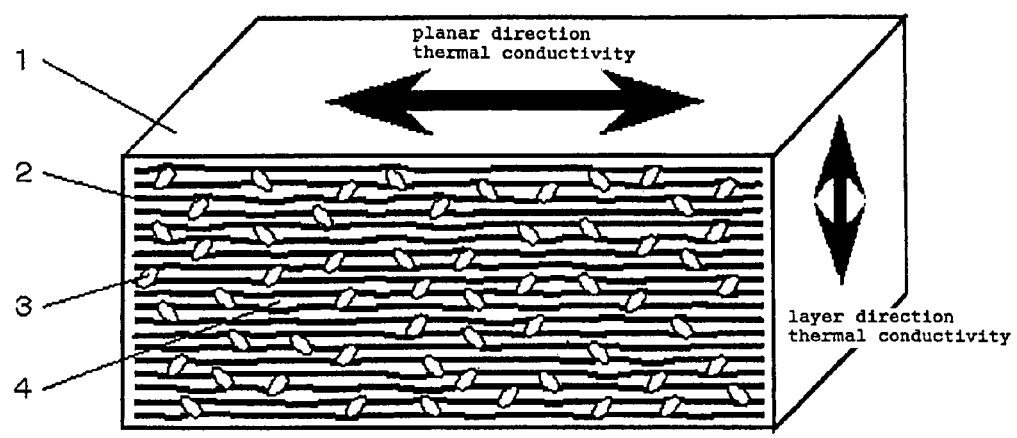
FIG. 2 is a simplified diagram of the high thermal conductive element of the present invention.

Furthermore, with the graphite structure 1 obtained by this method, a structure in which numerous pores are included in the interior of the structure and in which the graphene layers are two-dimensionally oriented can be obtained by adjusting the heating conditions (primarily the heating rate) or by admixing a suitable amount of the above-mentioned filler prior to heating. When specific pores are formed, the density of the resulting graphite structure 1 can be made lower (0.3 to 2 g/cm$^3$) than the original density of the graphite (~2.26 g/cm$^3$). FIG. 2 shows numerous pores 4 present in the graphite structure 1.

With a structure such as this, the resulting graphite structure 1 is flexible enough not to readily break, etc., when bent, and is able to deform suitably under compression. These characteristics afford greater freedom of design when the product is used as a thermally conductive member, and also lower the thermal contact resistance with the heating source.

Embodiment 3

As discussed in Embodiment 2 above, the high thermal conductive element of the present invention can be produced by using a pre-graphitized material as the carbon particles. In contrast, in Embodiment 3, the high thermal conductive element of the present invention is manufactured by pre-blending a precursor of carbon as the raw material for the carbon particles, then simultaneously graphitizing this precursor in the course of graphitizing the matrix in the above-mentioned step II, and dispersing the graphite particles in the graphite structure. An example of this will be described in this Embodiment 3.

The basic production steps may be the same as in Embodiment 2.

In step I, an organic polymer that is a precursor of carbon is mixed and dispersed in a first organic polymer solution dissolved in a solvent, and this product is put in a specific shape, after which the solvent is volatilized to solidify the material, and a dehydration reaction is conducted by heating, for example, which produces a second organic polymer (polyimide) that can be readily graphitized.

The following step II may also be the same as in Embodiment 2. The result of this step is that the second organic polymer turns into a graphite structure with high thermal conductivity in the planar direction, and that the organic polymer dispersed in the interior is also carbonized and further graphitized. Accordingly, it is possible to obtain a high thermal conductive element in which graphite particles are dispersed within a graphite structure. This makes it possible to improve the thermal conductivity in the layer direction as well.

ADVANTAGES OF THE INVENTION

The high thermal conductive element of the present invention has a structure in which carbon particles that provide thickness direction in the layer direction are dispersed in a graphite structure with high thermal conductivity in the planar direction, so a high thermal conductive element having overall high thermal conductivity can be provided. With this constitution, heat efficiently propagates via the carbon particles in the layer direction (thickness direction) as well. As a result, the thermal conductivity κ⊥ in the layer direction is higher than with a graphite structure alone.

With the constitution of the present invention, if the high thermal conductive element is in the form of a film, it takes up less space and can be formed into various shapes, which broadens the range (freedom) of applicability as a thermally conductive member.

Also, with the constitution of the present invention, if pores are included in the interior of the graphite structure, it will be easy for carbon particles that promote thermal conduction in the layer direction to be contained in a favorable configuration, and the high thermal conductive element thus obtained will have flexibility and compressibility.

Flexibility, as referred to in this Specification, indicates flexural resistance with respect to a bending treatment. Including pores in the member of the present invention greatly increases the number of flexing cycles. Also, compressibility indicates deformability with respect to a compression treatment, and including pores in the high thermal conductive element of the present invention increases conformity with the heating source, etc., and allows thermal resistance to be suppressed.

With the manufacturing method of the present invention, a graphite structure that is highly oriented can be produced with relative ease, and carbon particles can be dispersed in the desired form within the graphite structure with relative ease.

Also, with the manufacturing method of the present invention, it is preferable to use a polyamic acid solution as the solution for forming the first organic polymer because the second organic polymer becomes a polyimide (PI), so handling is facilitated and a graphite structure with high orientation can be formed.

Since the heat radiating system of the present invention makes use of the above-mentioned high thermal conductive element, excellent thermal conductivity can be achieved in the layer direction as well. This makes it possible to construct a heat radiating system with excellent heat radiation characteristics. Also, when a sheet-form high thermal conductive element is used, its flexibility affords greater freedom in the shape of the heat radiating system, making it possible to design heat radiating system that can be used in a wide variety of applications.

INDUSTRIAL APPLICABILITY

The high thermal conductive element of the present invention is not only useful as a heat radiating system material used for various types of electronic device or components thereof where heat management is necessary, such as CPUs and lasers, but can also be worked into a variety of configurations and used in a wide range of applications that require uniform heat, such as substrate stages and mask stages.

EXAMPLES

Examples and comparative examples will now be given, and the features of the present invention will be described in further detail. The scope of the present invention, however, is not limited to or by these examples.

Example 1-1

Figure 7:
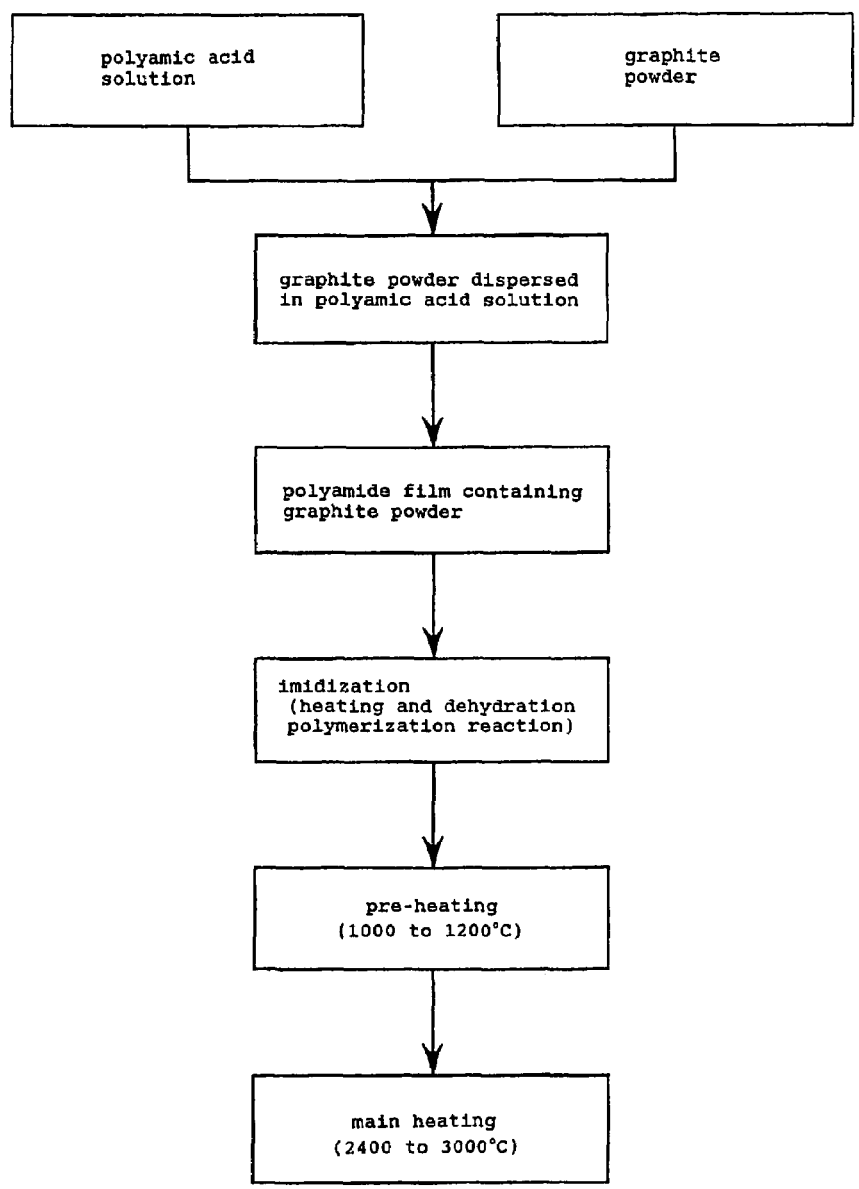
FIG. 7 is a flowchart of producing the high thermal conductive element in Example 1-1.

An example will be described of producing a graphite structure by using a polyimide as an organic polymer material in which graphite powder is mixed/dispersed, and subjecting this material to a heating treatment. FIG. 7 is a flowchart of the main steps in this process.

First, a polyamic acid solution was prepared as a polyimide precursor organic polymer solution. 5.00 g of bis(4-aminophenyl) ether and 120 mL of dimethylacetamide were put in a round-bottom flask and stirred and dissolved inside a dry box filled with nitrogen (N$_2$) gas.

5.45 g of pyromellitic anhydride was added to this solution, and the system was stirred for approximately 3 hours, which produced a polyamic acid solution (first organic polymer material).

A graphite powder (thermal conductivity: ~200 W/m·k) that had been pulverized in a jet mill to an average particle size of 4 µm was mixed in a weight ratio of 5% in the polyamic acid solution thus produced, and was uniformly dispersed for 12 hours with a ball mill. The particle size of the graphite powder is not limited to 4 µm, and particles slightly larger (>20 µm) or smaller than this could also be dispersed substantially uniformly.

A slide glass was coated with the graphite powder-containing polyamic acid solution produced above, forming a graphite powder-containing polyamic acid film (thickness: ~500 µm). This coating film was dried for about 1 hour in a nitrogen atmosphere, after which it was dried for 2 hours (room temperature) in a reduced-pressure oven, then heated to 100° C. and heat treated for 1 hour. As a result, the solvent component of the solution was evaporated off, forming a polyamic acid film in the interior of which graphite powder was dispersed.

This polyamic acid film was placed in a glass tube oven, put under a vacuum, and heat treated for 1 hour at 300° C., which imidized the polyamic acid film.

The polyimide film thus obtained was peeled from the slide glass, and its thickness was measured with a micrometer and found to be approximately 50 µm.

Figure 8:
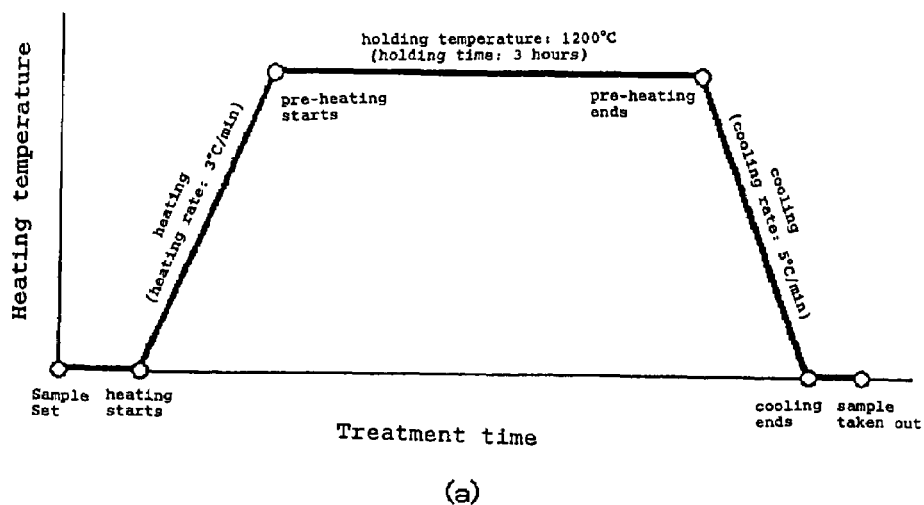
FIG. 8 consists of graphs of examples of temperature programs for the heating process in Example 1-1.
Figure 8:
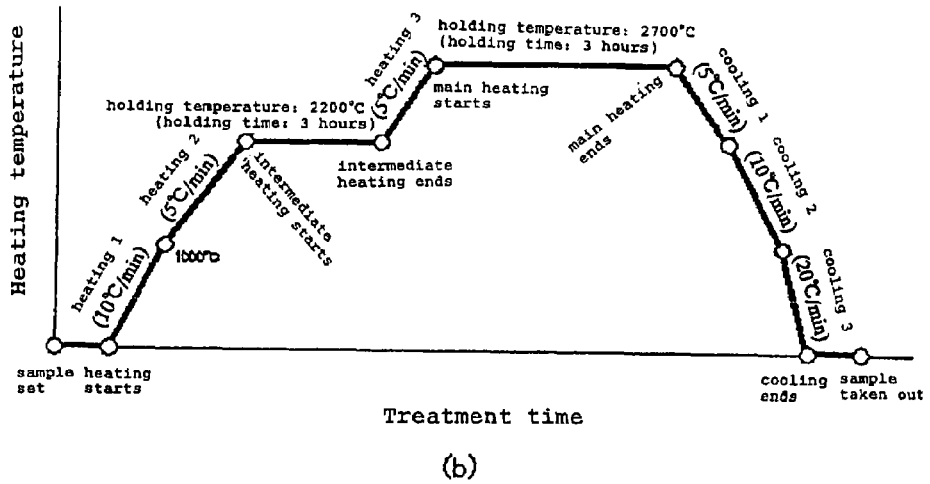

The organic polymer (polyimide) thus obtained was put in an electric furnace and subjected to a heating treatment. FIG. 8a shows the temperature profile of the pre-heating employed in this example.

First, as pre-heating, the temperature was raised from room temperature to 1200° C. at a rate of 3° C./min in an argon atmosphere, and the pre-heating temperature of 1200° C. was held for 3 hours. The heating rate may be determined after taking into account the type and shape of the organic polymer film to be heated, but is generally no more than 15° C./min, and in this example 3° C./min was employed. After the heating treatment, it was cooled to room temperature at a rate of 5° C./min. The cooling rate in this cooling generally does not need to be controlled as strictly as the heating rate, but 10° C. or less is preferable, and 5° C./min was employed in this example.

In this pre-heating step, the organic polymer is pyrolyzed and gives off nitrogen, oxygen, and hydrogen, reducing the weight by 50 to 60% compared to the starting raw material, and converting the polymer into a carbonized film in which graphite powder is dispersed. Therefore, this pre-heating has no effect whatsoever on the dispersed graphite powder.

After pre-heating was performed under the above conditions, main heating was performed by moving the sample to an ultra-high-temperature furnace. FIG. 8b shows the temperature profile. In this example, the heating rate was 10° C./min up to 1000° C., after which the rate was lowered to 5° C./min, and an intermediate hold was provided for 1 hour at 2200° C. (intermediate treatment temperature). Then, the heating rate was 5° C./min up to the main heating temperature of 2700° C., and the hold time at 2700° C. was 3 hours. Cooling after this heating temperature holding period involved lowering the temperature to 2200° C. at a rate of 5° C./min, then to 1300° C. at 10° C./min, then to room temperature at 20° C./min.

The graphite structure thus obtained (hereinafter sometimes referred to simply as "structure") had a film thickness of approximately 100 µm. A cross section of this structure was observed under a scanning electron microscope (SEM), which confirmed that the graphite structure consisting of stacked graphene layers. Furthermore, numerous fine pores (numbered 4 in FIG. 2) were confirmed to be present in the interior of the structure. The mechanism by which these pores are formed is still unclear, but the pores seem to be attributable to this heating program. It was also noted that the graphite powder that had been mixed/dispersed cut across the graphene layers oriented in the planar direction.

The crystal structure of the graphite structure thus formed was evaluated by X-ray diffraction analysis, which revealed the same graphite (002) and its high-order peak as in FIG. 5, as well as a faint graphite diffraction pattern other than the (00a) plane (a is an integer). Since the former is attributable to the crystal plane of the graphite structure, it can be seen that even when powdered graphite is contained, a graphite structure is obtained with sufficiently high orientation in the planar direction. The latter, the slight diffraction pattern other than the (00a) plane, is believed to be attributable to the graphite powder dispersed in the graphite structure.

The thermal conduction characteristics of the graphite powder-containing graphite structure obtained above were evaluated. As a result, the thermal conductivity $\kappa\|$ in the planar direction was 600 W/m·k, which is the same as the value when no graphite powder is contained. Meanwhile, the thermal conductivity $\kappa\perp$ in the layer direction (thickness direction) was 25 W/m·k, which was several times higher than in the past.

Therefore, it was confirmed that a graphite structure that also has high thermal conductivity in the layer direction is obtained by mixing/dispersing graphite powder into a highly oriented graphite structure.

Also, the result of numerous fine pores being present in the interior of the graphite structure produced in this example was that a high thermal conductive element with excellent bendability and compressibility was obtained.

Example 1-2

A high thermal conductive element was produced by the same steps as in Example 1-1 above, except that the size of the graphite particles was changed.

In this example 1-2, the graphite particles used in Example 1-1 were further pulverized, down to a particle size of about 0.1 to 0.3 µm. Other than mixing/dispersing these graphite particles in an amount of 3 wt % in polyamic acid (the first organic polymer solution), a high thermal conductive element composed of a graphite structure was formed by the same steps.

The thermal conduction characteristics of the sample thus obtained were evaluated, and the thermal conductivity $\kappa\|$ in the planar direction was 600 W/m·k, just as in Example 1-1 above. Meanwhile, the thermal conductivity $\kappa\perp$ in the layer direction increased to 50 W/m·k. The reasons for this seem to be that the dispersibility of the mixed graphite particles was higher, and that there were more thermal connection points between the graphene layers due to the particles being made smaller.

In addition, graphite structures were produced by varying the size of the above-mentioned graphite powder between 0.05 and 20 µm. As a result, it was confirmed that the thermal conductivity in the layer direction increased in every case.

Example 1-3

The results given here are for when the concentration of mixed/dispersed graphite particles was changed in the production of a high thermal conductive element composed of a graphite structure by the same process as in Example 1-1 above.

In this example 1-3, the graphite particles used in Example 1-1 were further pulverized down to a particle size of about 0.1 to 0.3 μm. The amount in which the graphite particles were added to the polyamic acid (first organic polymer solution) was varied between 10 ppm and 10 wt % to form high thermal conductive elements composed of a graphite structure.

The thermal conduction characteristics of the samples thus obtained were evaluated, and the thermal conductivity κ∥ in the planar direction was 600 W/m·k, just as in Example 1-1 above. Meanwhile, the thermal conductivity κ⊥ in the layer direction increased to between 10 and 50 W/m·k.

Example 1-4

A polyimide (second organic polymer) was produced by adjusting the concentration of the polyamic acid solution so that the polyimide film thickness would be approximately 15 μm in the production of a graphite powder-containing polyimide (carbon precursor) by the same process as in Example 1-2 above.

This sample was baked under the same temperature profile as in Example 1-1 above, and as a result it was confirmed that pores did not readily form in the interior of the resulting graphite structure. The cause of this is not clear, but it was found that when the polyimide film (carbon precursor) was made thinner, the resulting graphite structure was more solid, with fewer pore regions.

The sample thus obtained had somewhat less flexibility than the sample of Example 1-1 above, and its bending resistance test characteristics and so forth were slightly inferior, but the levels posed no practical problems. The thermal conduction characteristics of this sample were evaluated, which revealed the thermal conductivity κ∥ in the planar direction to be 980 W/m·k. Meanwhile, the thermal conductivity κ⊥ in the layer direction remained at 50 W/m·k. The reason for this is believed to be that the reduction in the quantity of pores increased the orientation in the planar direction.

Example 1-5

In the above examples, a high thermal conductive element was produced by a pyrolytic method using a graphite powder with a thermal conductivity κ∥ of about 200 W/m·k, but in this example, highly oriented graphite with high in-plane thermal conductivity (κ∥=600 W/m·k) was powderized and added to a graphite structure.

"PGS Graphite" made by Matsushita Electric Industrial (graphite sheet with thickness of 125 μm) that had been pulverized in a jet mill was used in this example (1-5). Observation of the graphite particles produced by the pulverization treatment revealed a particle size of about 1 μm, but since the original PGS graphite sheet consists of graphite that is strongly oriented in the planar direction, there was pronounced separation of the graphene layer portion during pulverization, resulting in a graphite powder more in the form of flakes than was the case in Example 1-1 above.

Figure 3:
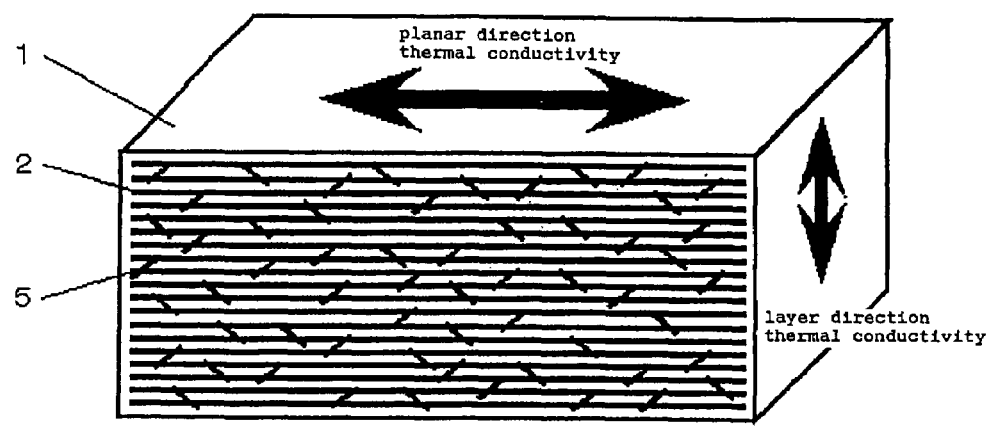
FIG. 3 is a simplified diagram of the high thermal conductive element of the present invention.

This graphite powder was mixed with polyamic acid and imidized by the same method as in Example 1-1, after which it was heated to produce a graphite structure. FIG. 3 is a simplified diagram of the high thermal conductive element composed of a graphite structure obtained in this example.

The thermal conduction characteristics of the sample thus obtained were evaluated, and the thermal conductivity κ∥ in the planar direction was 600 W/m·k, just as in Example 1-1. The thermal conductivity κ⊥ in the layer direction was 80 W/m·k. The reason for this seems to be an increase in thermal connection in the layer direction because the thermal conductivity of the graphite powder dispersed in the graphite structure is higher than that of a conventional graphite material.

A graphite powder composed of a PGS graphite sheet was pulverized even finer (particle size: 0.2 to 0.4 μm), and the same graphite structure was produced. As a result, the thermal conductivity κ⊥ in the layer direction increased to 98 W/m·k.

Example 1-6

The carbon precursor organic polymer material used in Example 1-1 above was a polyimide, but it was confirmed that a graphite powder-containing graphite structure can be produced by the same method as above using other organic polymer materials.

An organic polymer obtained by adding graphite powder to each precursor solution, solidifying, and then performing a heating dehydration reaction or the like, was subjected to a heating treatment with a specific temperature profile, which produced a high thermal conductive element. More specifically, a graphite powder-containing graphite structure was obtained from organic polymer materials other than polyimide, such as polyamide (PA), polyphenylene terephthalamide (PPTA), polyphenylene oxadiazole (POD), polybenzothiazole (PBT), polybenzobisthiazole (PBBO), polyphenylene benzoimidazole (PBI), polyphenylene benzobisimidazole (PPBI), polythiazole (PT), and polyparaphenylenevinylene (PPV).

Example 1-7

A high thermal conductive element was produced by dispersing in the interior a graphite powder mixed with a powder composed of an organic polymer material that could be graphitized in the course of heating, by the same process as in Example 1-1 above.

In this example 1-7, a polyimide powder with an average particle size of about 5 to 10 μm was mixed into a polyamic acid solution, a polyamic acid film in which was dispersed a powder composed of a polymer material was formed, and then the polyamic acid was polyimidized.

The polyimide obtained in the above process was put in an electric furnace and subjected to a heating treatment. The same temperature profile as in Example 1-1 was employed in this example as well.

As a result, first, in the pre-heating process, the second organic polymer portion was pyrolyzed into a carbon film, and the organic polymer powder contained in the interior was also carbonized.

It was also confirmed that in the main heating process, the second organic polymer portion changed into a graphite structure consisting of stacked graphene layers, and the portion where the organic polymer powder to be undergone carbonization also was carbonized and converted into graphite having a layered structure.

The thermal conduction characteristics of the graphite powder-containing graphite structure thus obtained were evaluated. As a result, the thermal conductivity κ∥ in the planar direction was approximately 600 W/m·k, just as in Example 1-1. The thermal conductivity κ⊥ in the layer direction (thickness direction) was from 20 to 40 W/m·k.

Therefore, it can be seen that a graphite structure with high thermal conductivity in the planar direction and improved thermal conductivity in the layer direction can also be obtained by dispersing a graphite powder whose starting raw material is an organic polymer material in the interior of a highly oriented graphite structure.

Example 1-8

A test-use heat radiating system was produced using the high thermal conductive element composed of a graphite structure obtained in Example 1-1 above, and its thermal resistance was measured. FIG. 9a is the constitution when the high thermal conductive element 9 of the present invention is disposed so as to radiate heat between a heating source 8 and a heat radiating member 10. For the sake of comparison, evaluations were also conducted using a copper sheet and a highly oriented graphite sheet (PGS Graphite Sheet made by Matsushita). The measurements were made under a constant pressure (10 N/cm$^2$).

As a result, the thermal resistance was 1.0° C./W in the case of the copper sheet, and was about 0.4° C./W with the highly oriented graphite sheet. In contrast, it was confirmed that when the high thermal conductive element of the present invention was used, thermal resistance improved to 0.3° C./W.

A similar improvement in thermal radiation characteristics was confirmed with the constitutions shown in FIGS. 9(b) and 9(c).

Example 2-1

This is an example of producing a graphite structure by using carbon nanotubes (CNT) as the carbon structure material, employing a polyimide as the organic polymer in which these CNT are mixed/dispersed, and subjecting these to heating treatment.

First, a polyamic acid solution was produced as a polyimide precursor-containing organic polymer solution. This procedure entailed adding 5.00 g of bis(4-aminophenyl) ether and 250 mL of dimethylacetamide to a round-bottom flask and stirring and dissolving these components inside a dry box filled with nitrogen ($N_2$) gas.

5.45 g of pyromellitic anhydride was added to this solution, and the system was stirred for approximately 3 hours, which produced a polyamic acid solution (first organic polymer).

CNT (length: ~1 µm) that had been pulverized in a jet mill or the like were mixed in an amount of 0.5 wt % into the polyamic acid solution obtained above, and were uniformly dispersed in the solution for 12 hours with a ball mill.

A slide glass was coated with the CNT-containing polyamic acid solution prepared above, forming a CNT-containing polyamic acid film (thickness: ~150 µm). This coating film was dried for a little over an hour in a nitrogen atmosphere, after which it was dried for 2 hours (room temperature) in a reduced-pressure oven, then heated to 100° C. and heat treated for 1 hour. As a result, a dark gray film was obtained.

This polyamic acid film was placed in a glass tube oven, put under a vacuum, and heat treated for 1 hour at 300° C., which formed a CNT-containing polyimide film.

The polyimide film thus obtained was peeled from the slide glass, and its thickness was measured with a micrometer and found to be approximately 15 µm.

The carbon precursor organic polymer film thus obtained was put in an electric furnace and subjected to a heating treatment. FIG. 8a shows the temperature profile of the pre-heating employed in this example.

First, as pre-heating, the temperature was raised from room temperature to 1200° C. at a rate of 3° C./min in an argon atmosphere, and the pre-heating temperature of 1200° C. was held for 3 hours. The heating rate may be determined after taking into account the type and shape of the organic polymer film to be heated, but is generally at least 1° C./min and no more than 15° C./min, and in this example 3° C./min was employed. After the heating treatment, the film was cooled to room temperature at a rate of 5° C./min. The cooling rate in this cooling generally does not need to be controlled as strictly as the heating rate, but at least 1° C./min and no more than 10° C. is preferable, and 5° C./min was employed in this example.

In this pre-heating step, the organic polymer is observed to be pyrolyzed and give off nitrogen, oxygen, and hydrogen, producing a carbonized film in which is dispersed only 50 to 60 wt % of the CNT compared to the starting raw material. Therefore, this pre-heating has no effect whatsoever on the dispersed CNT.

After pre-heating was performed under the above conditions, main heating was performed by moving the sample to an ultra-high-temperature furnace. FIG. 8(b) shows the temperature profile. In this example, the heating rate was 10° C./min up to 1000° C., after which the rate was lowered to 5° C./min, and an intermediate hold was provided for 1 hour at 2200° C. (intermediate treatment temperature). Then, the heating rate was 5° C./min up to the main heating temperature of 2700° C., and the hold time at 2700° C. was 3 hours. Cooling after this main heating temperature holding period involved lowering the temperature to 2200° C. at a rate of 5° C./min, then to 1300° C. at 10° C./min, then to room temperature at 20° C./min.

The film thickness of the graphite structure thus obtained was approximately 30 µm. A cross section of this structure was observed under a scanning electron microscope (SEM), which confirmed that the graphite structure consisting of stacked graphene layers. It was also noted that the CNT that had been mixed/dispersed cut across the graphene layers oriented in the planar direction.

The crystal structure of the graphite structure thus formed was evaluated by X-ray diffraction analysis, which revealed the same graphite (002) and its high-order peak as in FIG. 5. This tells us that even when CNT are contained, a graphite structure is obtained with sufficiently high orientation in the planar direction.

The thermal conduction characteristics of the CNT-containing graphite structure obtained above were evaluated. As a result, the thermal conductivity $\kappa\|$ in the planar direction was ~980 W/m·k, which is the same as the value for a graphite structure produced without any CNT. Meanwhile, the thermal conductivity $\kappa\bot$ in the layer direction (thickness direction) was 50 to 60 W/m·k, which was about ten times higher than in the past.

Therefore, it was confirmed that a graphite structure that also has high thermal conductivity in the layer direction is obtained by mixing/dispersing CNT into a highly oriented graphite structure.

Example 2-2

A high thermal conductive element was produced by the same steps as in Example 2-1, except that the concentration of the mixed/dispersed CNT was changed.

A high thermal conductive element was formed by varying the concentration of CNT between 10 ppm and 10 wt % in the polyamic acid (first organic polymer solution).

The thermal conduction characteristics of the sample thus obtained were evaluated, and the thermal conductivity $\kappa\|$ in the planar direction was 900 to 980 W/m·k, just as in Example 2-1 above. Meanwhile, the thermal conductivity κ⊥ in the layer direction was 10 to 70 W/m·k.

Example 2-3

A polyimide film (second organic polymer) was produced by the same process as in Example 2-1, adjusting the concentration of the polyamic acid solution so that the polyimide film thickness would be approximately 50 μm.

This sample was baked under the same temperature profile as in Example 2-1, and as a result it was confirmed that numerous fine pores (the "pores 4" in FIG. 2) were present in the interior of the resulting graphite structure. The cause of this is not clear, but it was found that with this heating profile, when the polyimide film (carbon precursor) was made thicker, there were more pore regions and the resulting graphite structure was less dense.

The thermal conduction characteristics of this sample were evaluated, which revealed the thermal conductivity κ∥ in the planar direction to be reduced to between 600 and 750 W/m·k, but the thermal conductivity κ⊥ in the layer direction remained at 50 W/m·k. The reason for this is believed to be that the inclusion of pores slightly decreased the orientation in the planar direction. In contrast, because numerous fine pore regions were present in the interior of the graphite structure produced in this example, it was possible to obtain a high thermal conductive element with excellent bendability and compressibility.

Example 2-4

A high thermal conductive element was produced using CNT in Example 2-1, but in this example diamond particles were added to a graphite structure.

In this example, diamond particles with an average size of 1 μm were mixed with polyamic acid, polyimidized, and heated to produce a graphite structure by the same method as in the above examples.

The thermal conduction characteristics of the sample thus obtained were evaluated, and as a result, roughly the same values were obtained for the thermal conductivity κ∥ in the planar direction (700 to 900 W/m·k) and the thermal conductivity κ⊥ in the layer direction (~50 W/m·k).

A similar high thermal conductive element also was obtained when the average size of the admixed diamond particles was varied between 0.1 and 10 μm.

Example 2-5

The carbon precursor organic polymer material used in Example 2-1 was polyimide, but it was confirmed that other organic polymer materials can also be used to produce a carbon structure-containing graphite structure by the same method as above. High thermal conductive elements were produced by adding a carbon structure to each precursor solution, forming a film, subjecting this to a heating dehydration reaction or the like, and subjecting this film to a heating treatment under a specific temperature profile. More specifically, a carbon precursor-containing graphite structure was obtained from organic polymers other than polyimide, such as polyphenylene terephthalamide (PPTA), polyphenylene oxadiazole (POD), polybenzothiazole (PBT), polybenzo-bisthiazole (PBBO), polyphenylene benzoimidazole (PBI), polyphenylene benzobisimidazole (PPBI), polythiazole (PT), and polyparaphenylenevinylene (PPV).

Example 2-6

The carbon structures used in Examples 2-1 and 2-4 were CNT and diamond, but it was confirmed that other carbon structure materials can also be used to produce a carbon structure-containing graphite structure by the same method as above. More specifically, a high thermal conductive element (a carbon structure-containing graphite structure) was obtained from carbon structures such as fullerene and diamond-like carbon particles.

Example 2-7

Heat radiating systems were assembled using the high thermal conductive elements obtained in Examples 2-1 to 2-6, and the thermal resistance thereof was measured.

FIG. 9a shows a system in which the high thermal conductive element 9 of the present invention is disposed so as to radiate heat between the heating source 8 and the heat radiating member 10. For the sake of comparison, evaluations were also conducted using a copper sheet and a highly oriented graphite sheet. The measurements were made under a constant pressure (10 N/cm²).

As a result, the thermal resistance was 1.0° C./W in the case of the copper sheet, and was about 0.4° C./W with the highly oriented graphite sheet. In contrast, it was confirmed that when the high thermal conductive element of the present invention was used, thermal resistance improved to 0.3° C./W.

A similar improvement in thermal radiation characteristics was confirmed with the constitutions shown in FIGS. 9(b) and 9(c).

The invention claimed is:

1. A high thermal conductive element comprising a graphite-based matrix and carbon particles dispersed in the graphite-based matrix, wherein
   (1) the c axis of the graphene layers constituting the graphite are substantially parallel,
   (2) the thermal conductivity κ∥ in a direction perpendicular to the c axis is at least 400 W/m·k and no more than 1000 W/m·k, and
   (3) the thermal conductivity κ⊥ in a direction parallel to the c axis is at least 10 W/m·k and no more than 100 W/m·k.

2. The high thermal conductive element according to claim 1, wherein the high thermal conductive element is in the form of a film, and the c axis is substantially parallel to the thickness direction of the film.

3. The high thermal conductive element according to claim 2, wherein the thickness of the film is at least 10 μm and no more than 300 μm.

4. The high thermal conductive element according to claim 2, wherein the high thermal conductive element is flexible.

5. The high thermal conductive element according to claim 1, wherein the graphite-based matrix indicates an X-ray diffraction pattern having one or more peaks for the (002″) plane wherein n is a natural number.

6. The high thermal conductive element according to claim 1, wherein the graphite-based matrix indicates an X-ray diffraction pattern having peaks for the (002) plane and the (004) plane.

7. The high thermal conductive element according to claim 1, wherein pores are present in the interior of the graphite-based matrix.

8. The high thermal conductive element according to claim 1, wherein the density of the high thermal conductive element is at least 0.3 g/cm³ and no more than 2 g/cm³.

9. The high thermal conductive element according to claim 1, wherein the carbon particles are contained in an amount of at least 10 weight ppm and no more than 10 wt %.

10. The high thermal conductive element according to claim 1, wherein the carbon particles are at least one selected from the group consisting of 1) graphite particles and 2) a carbon structure other than graphite.

11. The high thermal conductive element according to claim 10, wherein the carbon structure is at least one selected from the group consisting of carbon nanotube, fullerene, diamond, and diamond-like carbon.

12. The high thermal conductive element according to claim 1, wherein all or part of the carbon particles is graphite.

13. The high thermal conductive element according to claim 1, wherein the average particle size of the carbon particles is at least 0.05 μm.

14. The high thermal conductive element according to claim 1, wherein the average particle size of the carbon particles is at least 0.05 μm and no more than 20 μm.

15. The high thermal conductive element according to claim 1, wherein the carbon particles are in the form of flakes.

16. A heat radiating system including a heating source, a heat radiating member, and a high thermal conductive element, wherein
 (1) the heating source and the heat radiating member are thermally connected via the high thermal conductive element, and
 (2) the high thermal conductive element is the high thermal conductive element according to claim 1.

17. The heat radiating system according to claim 16, wherein the high thermal conductive element is in the form of a film.

18. The heat radiating system according to claim 17, wherein at least one selected from the group consisting of the heating source and the heat radiating member is disposed in contact with the surface of the film.

19. The heat radiating system according to claim 16, wherein the high thermal conductive element is flexible.

20. The heat radiating system according to claim 16, wherein the high thermal conductive element has one or more curved portions.

21. The heat radiating system according to claim 16, wherein the heat radiating member is a cooling fin.

* * * * *